United States Patent
Yap et al.

(10) Patent No.: US 6,387,793 B1
(45) Date of Patent: May 14, 2002

(54) METHOD FOR MANUFACTURING PRECISION ELECTROPLATED SOLDER BUMPS

(75) Inventors: Daniel Yap; Phillip H. Lawyer, both of Thousand Oaks, CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

(21) Appl. No.: 09/522,803

(22) Filed: Mar. 9, 2000

(51) Int. Cl.$^7$ .............................................. H01L 21/44

(52) U.S. Cl. ...................... 438/612; 438/614

(58) Field of Search .................. 438/612, 614, 438/618, 627, 628, 637, 613; 257/751, 750

(56) References Cited

U.S. PATENT DOCUMENTS

| | | | | |
|---|---|---|---|---|
| 3,663,184 A | * | 5/1972 | Wood et al. ............... | 428/620 |
| 4,661,375 A | * | 4/1987 | Thomas ...................... | 438/614 |
| 5,162,257 A | | 11/1992 | Yung ........................... | 437/183 |
| 5,376,584 A | | 12/1994 | Agarwala .................... | 437/183 |
| 5,480,835 A | | 1/1996 | Carney et al. .............. | 437/189 |
| 5,492,235 A | * | 2/1996 | Crafts et al. ................ | 438/695 |
| 5,736,456 A | * | 4/1998 | Akram ......................... | 439/614 |
| 5,767,010 A | * | 6/1998 | Mis et al. .................... | 438/614 |
| 5,773,359 A | * | 6/1998 | Mitchell et al. ............ | 438/614 |
| 6,133,136 A | * | 10/2000 | Edelstien .................... | 438/168 |

FOREIGN PATENT DOCUMENTS

| | | | | |
|---|---|---|---|---|
| JP | 61225839 A | * | 10/1986 | ..................... 21/92 |

OTHER PUBLICATIONS

Imler, W.R., "Precision Flip–Chip Solder Bump Interconnects for Optical Packaging," *IEEE Transactions on Components, Hybrids, and Manufacturing Technology*, vol. 15, No. 6 (Dec. 1992), pp. 977–981.

Kawanobe, T., et al., "Solder Bump Fabrication by Electrochemical Method for Flip Chip Interconnection," *IEEE*, Publication CH1671–7/0000 (1981), pp. 149–155.

Yung, E.K., et al., "Flip–chip Process Utilizing Electroplated Solder Joints," MCNC Technical Report TR90–43, Oct. 1990.

* cited by examiner

*Primary Examiner*—Charles Bowers
*Assistant Examiner*—Brook Kebede
(74) *Attorney, Agent, or Firm*—Ladas & Parry

(57) ABSTRACT

A method for fabrication of a solder bump, comprising applying preferably an insulating film, followed by applying a multilayer underbump metallization, a layer of a photoresist, and a thin layer of titanium on a substrate containing, preferably, III–V semiconductor circuits. The multilayer UBM pad, preferably comprising a 0.02 to 0.05 micrometer thick layer of titanium, a 0.5 to 1.0 micrometer thick layer of nickel and a 0.1 to 0.2 thick layer of gold. The protective film with the thickness of preferably 0.5 to 40 micrometer comprises a photoresist. After the solder has been electroplated, the protective film is removed, preferably by dry etching or with a solvent. The titanium film serves a dual function of being a membrane for electroplating of the solder and of being a non-wettable dam for wetting back of the plated solder. The titanium film with the thickness of 200 to 1,000 Angstroms is preferably deposited by evaporation. After the solder has been electroplated, much of the titanium film is removed, preferably by wet etching or dry etching, leaving only a band of titanium that surrounds the disk of solder. A multilayer solder bump structure for III–V semiconductor circuits manufactured using this method, comprising, preferably, an insulating film, a multilayer underbump metallization layer, and remnants of the thin titanium film.

24 Claims, 7 Drawing Sheets

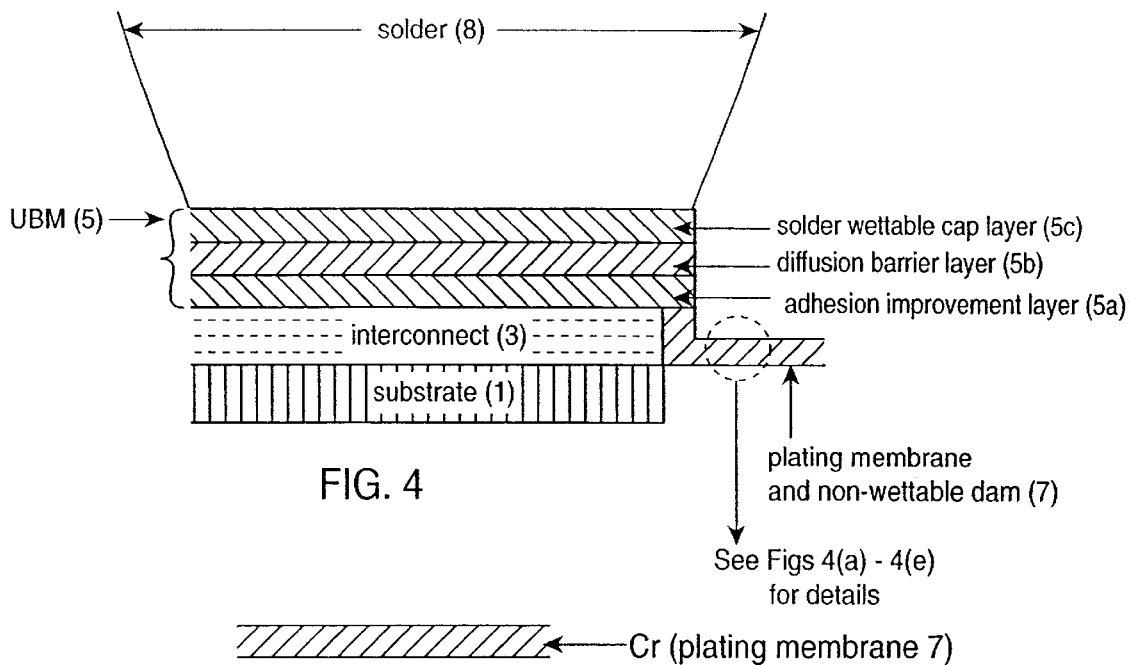
FIG. 4
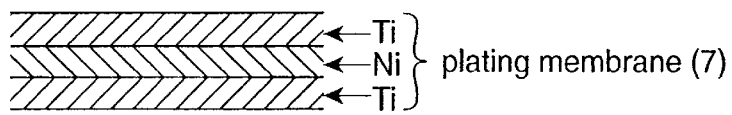
FIG. 4(a)
FIG. 4(b)
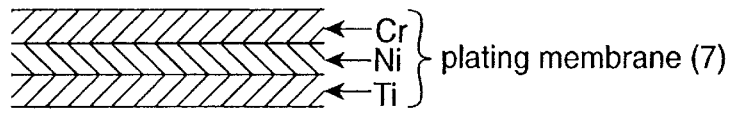
FIG. 4(c)
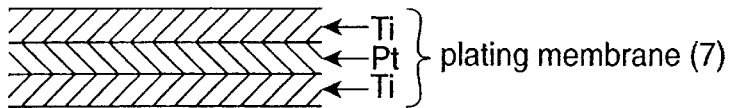
FIG. 4(d)
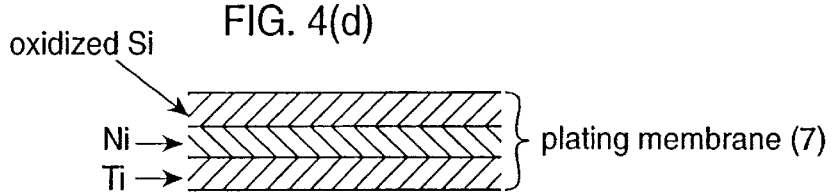
FIG. 4(e)

METHOD FOR MANUFACTURING PRECISION ELECTROPLATED SOLDER BUMPS

I. BACKGROUND OF THE INVENTION

1. Field of the Invention

This invention relates to the field of solder bump structures compatible with group III–V semiconductor materials. More particularly, the present invention pertains to the use of a novel electroplating method of fabrication of the solder bumps which method does not damage air bridges, microelectromechanical structures, or optical surfaces that can be otherwise damaged if conventional methods for fabricating solder bumps are used.

2. Description of the Related Art

Prior or related art teaches methods of fabrication of a number of solder bump structures. The prior art methods include a method of vacuum evaporation and a method of electroplating.

The structure shown in FIG. 1(*a*) contains a solder bump formed by deposition in a vacuum evaporator. See W. R. Imler, et al., IEEE Transactions on Components, Hybrids, and Manufacturing Technology, v. 15, p. 977, 1992. The solder bump resides above a multilayer pad that consists of titanium, tungsten nitride, nickel alloy, and gold. This structure also contains an oxidized silicon passivation film which serves as a non-wettable dam to constrain the solder wet back. The solder bumps are deposited through metal shadow masks clamped over the surface of the substrate wafer. A solder pad diameter of 75 micrometers at a pitch of 156 micrometers has been achieved with this technique. A disadvantage of the shadow-masked evaporation method is that solder bumps having smaller diameter and finer pitch are difficult to achieve yet such smaller diameter and finer pitch bumps are often needed.

The structure shown in FIG. 1(*b*) contains a solder bump formed by electroplating. See T. Kawanobe, K. Miyamoto, and Y. Inaba, IEEE publication CH1671-7/0000, p. 149, 1981. The solder bump resides on multilayer underbump metallization (hereinafter, UBM) that consists of titanium and copper films and an electroplated nickel pad. A 2 micrometer thick copper film serves as a plating membrane for the electroplating of the lead/tin solder. The titanium film is designed to serve as an adhesion layer between the copper film and the underlying aluminum metallization, passivation film or silicon substrate. After the electroplating, the copper and titanium films are wet etched away, leaving only a small pad of UBM material underneath the solder. Electroplated solder bumps can have quite fine pitch, e.g. 50 micrometer diameter pads with 100 micrometer pitch is typical.

However, when the solder bump is formed by electroplating, the plating membrane must be removed subsequently in order to avoid short circuiting the various solder bump joints that exist on a substrate. It is difficult to find suitable underbump metallization and plating membrane materials that can be etched away without also attacking the solder or the underlying circuitry. Copper is typically used as the plating membrane because its etchant does not attack the lead/tin solder. Copper, however, is not compatible with group III–V semiconductor materials. In addition to avoiding an attack on the solder bump itself, some provision is needed to protect the circuit elements from attack by the plating bath and by the etchants used to remove the membrane. In the structure of FIG. 1(*b*), a permanent passivation film, formed underneath the UBM and typically consisting of silicon dioxide or polyimide, protects the circuit elements. That passivation film also serves as a non-wettable surface or solder dam which causes the plated solder to wet back onto the pad.

The known electroplating method described above has some serious disadvantages and is not usable with group III–V semiconductor materials. In addition to the impossibility to use copper due to its incompatibility with group III–V semiconductor materials, for some MMICs, microelectromechanical elements or optoelectronic devices, it may not be possible to protect key features such as air bridges, cantilever beams or optical coatings and surfaces with a permanent passivation film. A removable protective film is needed. Another need is to have a solder dam that covers only the vicinity of the solder bump. Also needed is a plating membrane that both is compatible with group III–V materials and that can be etched away without attacking the plated solder.

For the foregoing reasons, there is a need for a method of fabrication of a solder bump having a small diameter and a very fine pitch, where a removable protective film is utilized. The plating membrane is needed that is compatible with group III–V semiconductor materials and that can be etched away without attacking the plated solder. The present invention offers such a solder bump and the method of manufacturing thereof.

II. SUMMARY OF THE INVENTION

The present invention is directed to a method of fabrication of a solder bump allowing to obtain very fine size bumps while a solder dam preferably only covers space in a vicinity of the bump. The method uses a plating membrane compatible with group III–V semiconductor materials and also with group IV semiconductor materials. After the completion of the fabrication process, the membrane is safely removed and the solder is unaffected by the agent used to remove the membrane. This invention is also directed to the solder bump structure obtained as a result of utilization of this method.

The solder bump structure and fabrication method of this invention avoid the need for depositing a permanent layer over the circuits to protect them from the solder-bump processing. Such a permanent layer can alter the performance of the circuits and devices. In accordance with the invention it is now possible to fabricate electroplated solder bumps while simultaneously protecting the circuit elements from such altered performance. For example, circuits for wireless communications may contain inductors, transmission lines or transistors that have air bridges which would be adversely affected by a permanent layer such as one found in the prior art. Also, future high-speed, high-density interconnects between processors may be based on chips of solder-bumped optoelectronic devices which also should not be covered by such a layer.

This invention uses a metal film, preferably of titanium, deposited above the protective film, to serve both as a plating membrane and a solder dam and uses a photodefinable polyimide, a spin-on glass, a spin-on conductive polymer, or, preferably, a photoresist as a removable protective film. The photoresist can be removed, after the solder plating and membrane etching, by solvents that do not attack the solder. The titanium film can be wet etched without attacking either the solder or the underlying circuit elements. The thickness of the titanium film is generally between 0.05 and 0.2 micrometers and is readily deposited onto the photoresist protective film. This thickness of titanium is significantly thinner than that of other films used previously as plating membranes. The suitability of a thin titanium film as a membrane for electroplating of solder is unexpected. The method does not require the use of copper.

III. BRIEF DESCRIPTION OF THE DRAWINGS

The features and advantages of the present invention will become better understood with regard to the following description, appended claims, and accompanying drawings where:

FIG. 4 is a schematic illustration showing an alternative embodiment of the solder bump structure.

FIGS. 4(a) through 4(e) are schematic illustrations each showing alternative embodiments of the plating membrane.

IV. DETAILED DESCRIPTION OF THE INVENTION

1. The Preferred Embodiments

Figure 1A:
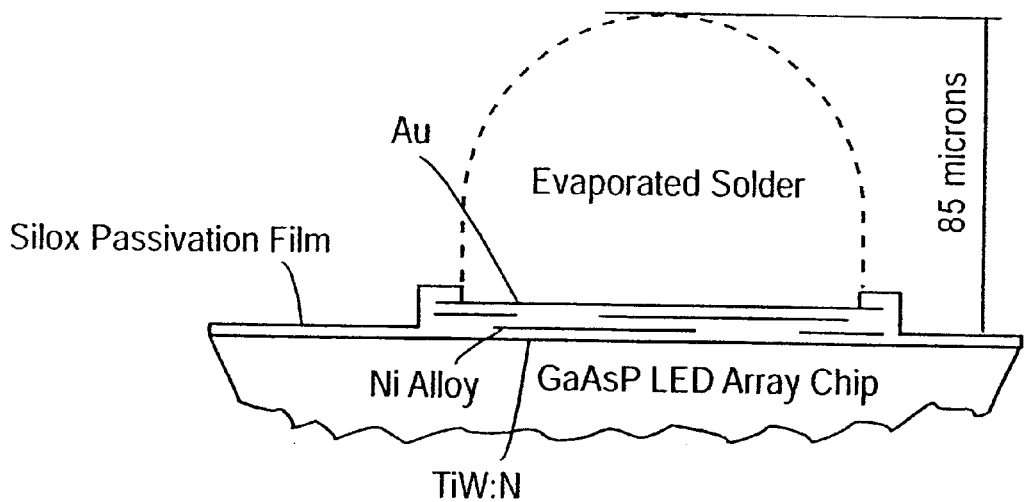
FIG. 1(a) is a schematic diagram showing prior art of fabricating solder bumps by shadow mask evaporation method.
Figure 1B:
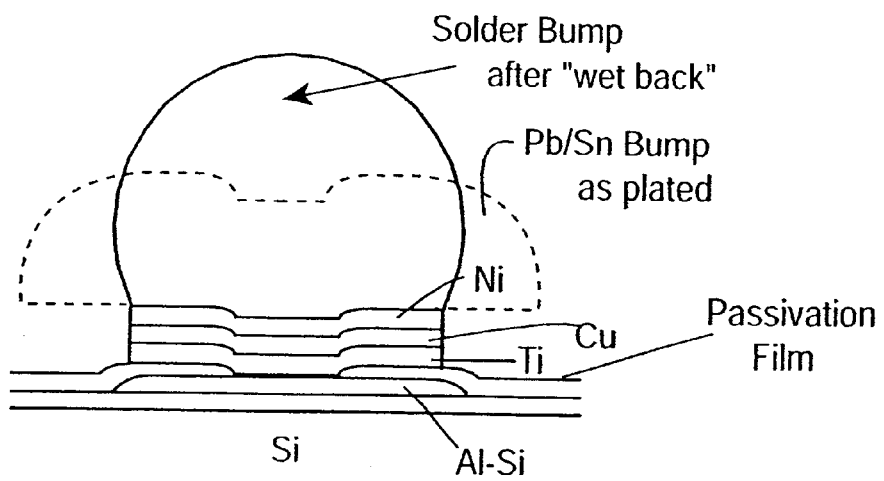
FIG. 1(b) is a schematic diagram showing prior art of fabricating solder bumps by electroplating method.
Figure 2:
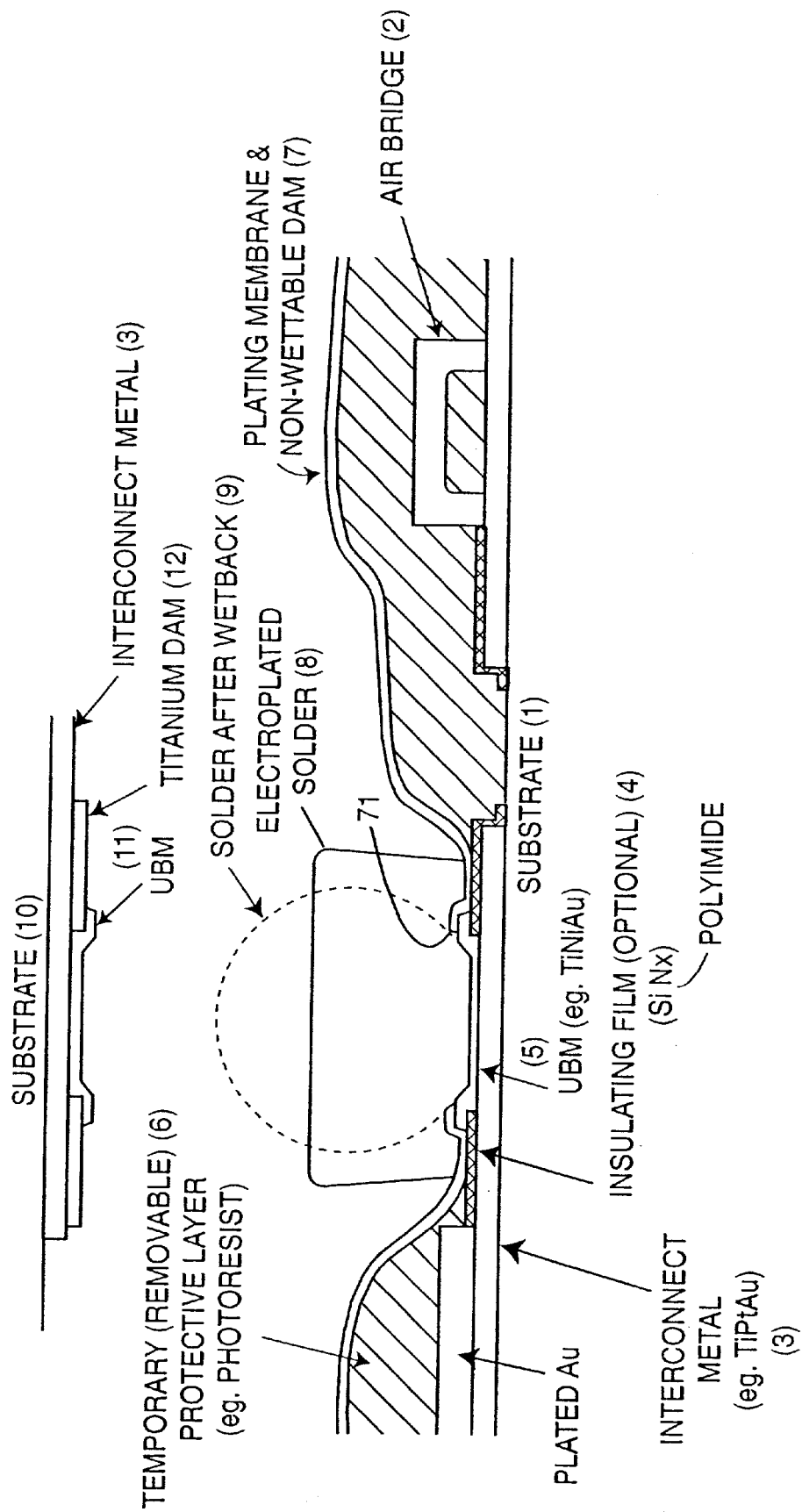
FIG. 2 is a schematic diagram showing a preferred embodiment of the solder bump structure of this invention.
Figure 2A:
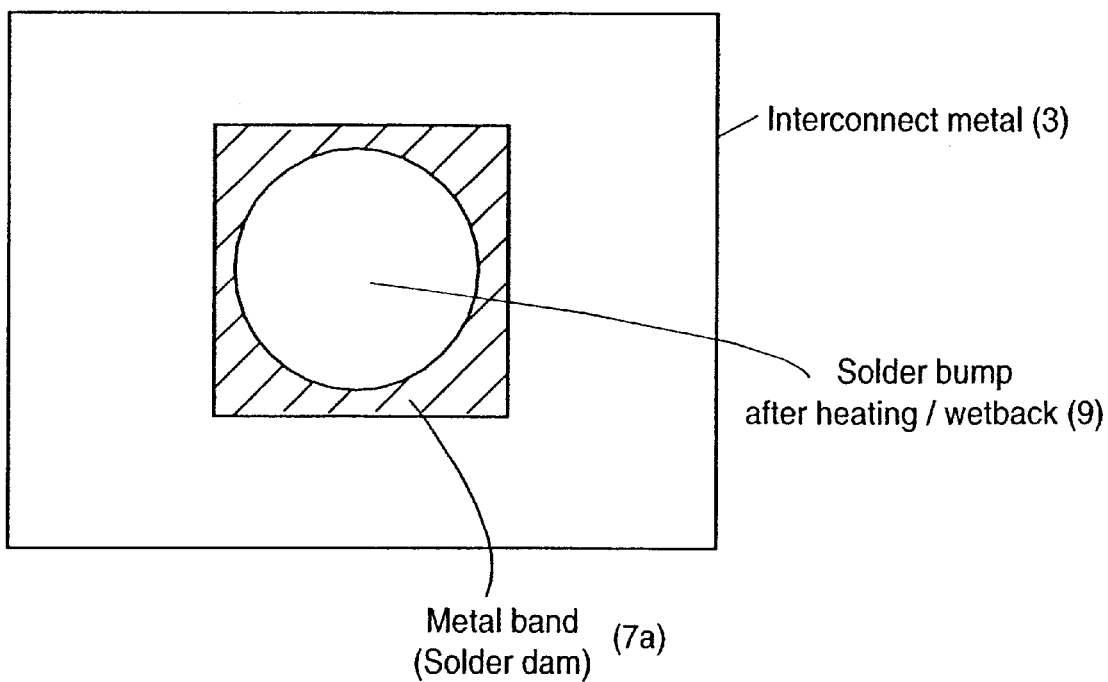
FIG. 2(a) is a plan view of the structure shown on FIG. 2 showing the same structure from above.
Figure 2B:
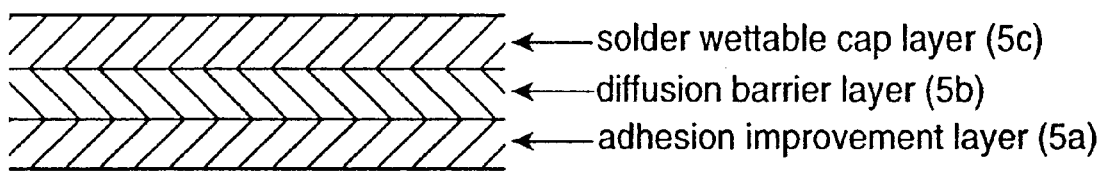
FIG. 2(b) is a schematic diagram showing the structure of the preferred embodiment of the underbump metallization layer.
Figure 3:
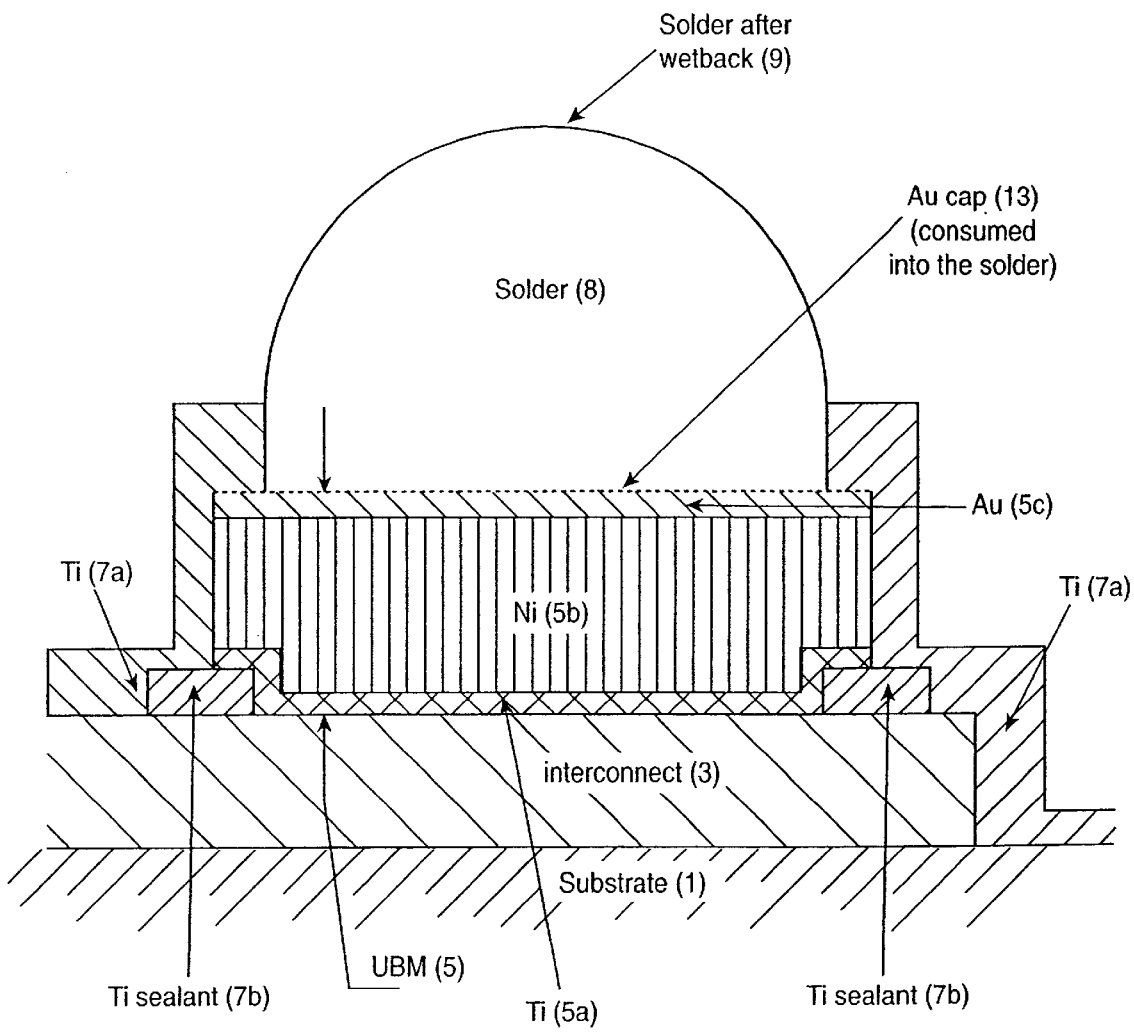
FIG. 3 is a schematic diagram showing a detailed illustration of interface between the solder, the pad, and the solder dam in the solder bump structure of this invention, including the use of a titanium sealant feature.

The preferred solder bump structure of this invention is illustrated in FIGS. 2, 2(a), and 3. The structure is formed on a substrate 1 that contains either group IV or group III–V semiconductor devices and circuits. The devices and circuits may contain exposed air bridges 2, microelectromechanical elements such as MEMS switches (not shown), and/or optoelectronic devices with exposed optical surfaces and coatings (not shown, either). These devices and circuits typically utilize exposed gold and/or titanium and/or platinum interconnect lines 3. The solder bump defining structure is a multilayer structure. The first layer is preferably an optional patterned insulating film 4 or a sealant feature on top of which the underbump metallization UBM 5 is applied followed by a patterned layer of a photoresist 6 and, finally, by a thin layer 7 of a metal, preferably, titanium.

Preferably the interconnect 3 is at least partially covered by an insulating film 4 in the vicinity of the UBM 5. At least a part of the UBM 5 overlaps the insulating film 4 (FIG. 2). The insulating film 4 is made of an electrically insulating material or dielectric, preferably, silicon nitride or polyimide. The preferred thickness of the insulating film 4 is within a range of 0.1 to 3.0 micrometers. A via is etched through the insulating film using known photolithographic patterning and etching techniques to allow for an electrical connection between the subsequently deposited UBM 5, which will occupy the via, and the interconnect metal 3.

Figure 3A:
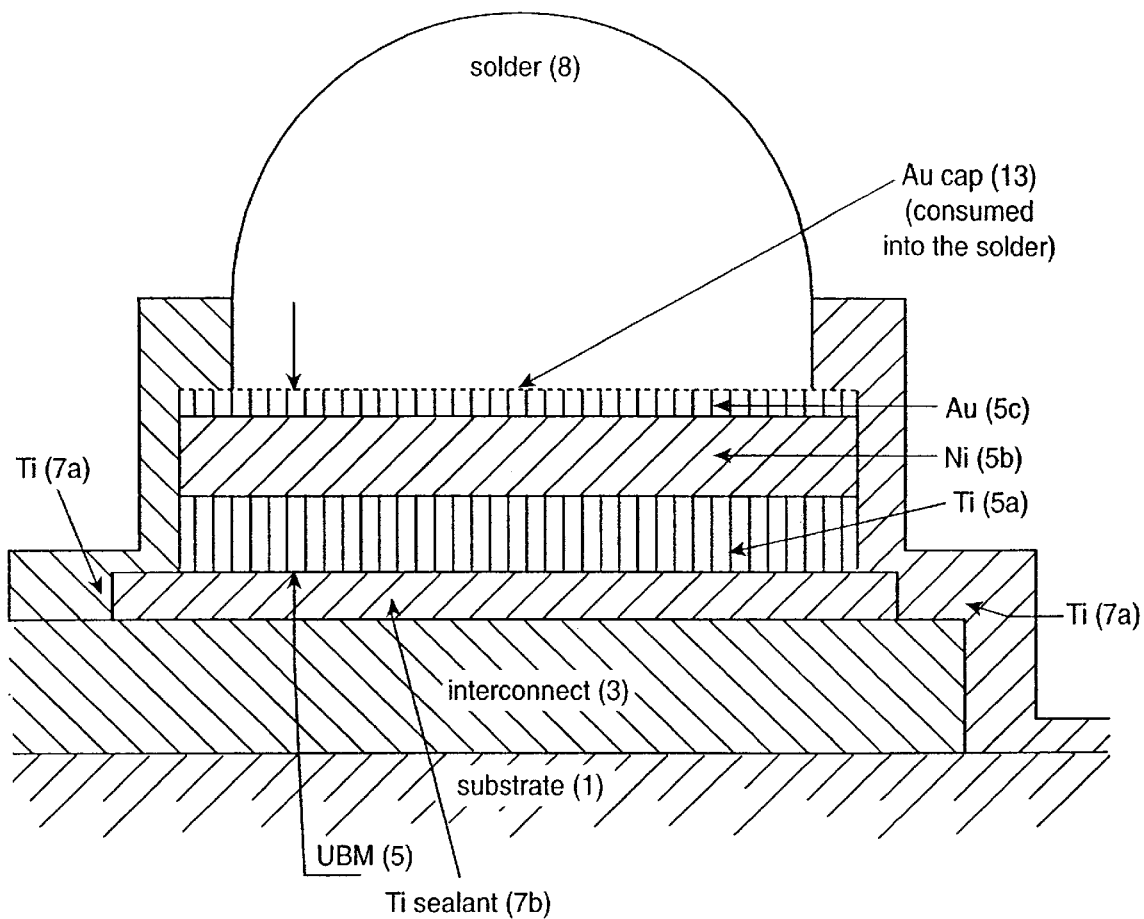
FIG. 3(a) is a schematic diagram showing a detailed illustration of another variation of interface between the solder, the pad, and the solder dam in the solder bump structure of this invention, including the use of a titanium sealant feature, where the titanium sealant feature occupies the entire interface area between interconnect and the pad.
Figure 3B:
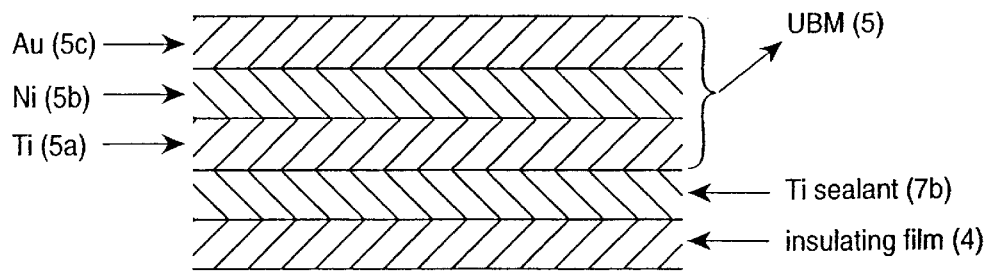
FIG. 3(b) is a schematic diagram showing an illustration of the relative positions of the pad, the titanium sealant feature, and the insulating film, where both the titanium sealant feature and the insulating film are used.

Alternatively, this alternative being an equally good choice, a patterned sealant feature 7b, made preferably of titanium, occupies the area in the vicinity of the UBM 5, as shown on FIG. 3. This sealant feature 7b preferably extends at least several micrometers beyond the edge or periphery of the UBM 5 and is preferably ring or annular shaped. Alternatively, the titanium sealant 7b can extend entirely or partially underneath the UBM 5 [See FIG. 3(a)]. The preferred thickness of this sealant feature 7b is between about 0.02 and 0.20 micrometers. This sealant feature 7b can be present instead of, or together with, the insulating film 4. If the sealant feature 7b is present together with the insulating film 4, the sealant feature 7b is arranged between the UBM 5 and the insulating film 4, as shown on FIG. 3(b).

The solder bump structure contains a solder pad or UBM 5 that is formed above or on a portion of the metal interconnect 3. In the preferred embodiment, the UBM 5 is formed over a portion of the insulating film 4. As is described below, with reference to FIG. 2(b) and FIGS. 3, 3(a) and 3(b) the multilayer UBM 5 pad preferably includes an adhesion improvement layer, preferably a layer of titanium 5a; a diffusion barrier layer, preferably a layer of nickel 5b; and a solder-wettable cap layer, preferably a layer of gold 5c. Of course, other metals that serve the same or similar functions, which functions are discussed below in greater detail, could be used instead additionally.

Layer 5a of the UBM 5 is an adhesion improvement layer. It is preferably a layer of titanium that serves to improve adhesion of the pad 5 to the underlying interconnect line 3 of the circuit (See FIGS. 2 and 3). A typical thickness for the adhesion improvement layer 5a is within a preferred range of between 0.02 and 0.05 micrometers. The adhesion improvement layer 5a, in combination with plating membrane 7, also serves to seal gold, often used in interconnect 3, from the solder 9 (See FIG. 2).

Any lead/tin solder that is in contact with gold can rapidly interdiffuse with gold. Such interdiffusion can consume the metal of the interconnect, often gold, and also can degrade the mechanical and thermal properties of the solder. Therefore, it is desired to isolate the gold in the interconnect 3 from solder 9.

A diffusion barrier layer 5b, preferably a layer of nickel, provides a diffusion barrier that prevents the metal used in interconnect 3 from being attacked by the lead/tin solder 9. A typical thickness for the diffusion barrier layer 5b is preferably within the range of between 0.5 and 1.0 micrometers.

A thin solder-wettable cap layer 5c, preferably a layer of gold, formed above the diffusion barrier layer 5b, serves as a solder-wettable, non-oxidized cap. Cap layer 5c is preferably kept thin so that it can be consumed into the solder when it is subsequently heated without significantly degrading the solder. A typical thickness for the solder-wettable cap layer 5c is preferably within the range of 0.05 and 0.2 micrometers. The UBM pad 5 is formed preferably by evaporation and liftoff. An image-reversal photolithography process is the preferred process to form a UBM pad 5, having a trapezoidal profile, that it is slightly smaller in diameter at the top.

A protective film 6 preferably covers the regions of the circuit that do not contain solder bumps. This protective film 6, which can be applied either before or after the UBM 5, is present while the remaining parts of the solder bump structure are being formed, and is typically and preferably comprises a layer of a removable photoresist. The protective film 6 should cover all of the elements of the circuit that need to be protected. The thickness of the photoresist is chosen to ensure this coverage and is preferably within the range of between 0.5 and 40 micrometers. The protective layer 6 also serves as a mechanical base for the plating membrane 7. The protective layer 6 is typically contour-baked after it is spun onto the substrate and patterned in order to round any edges in the film which might produce breaks in the plating membrane 7 when that membrane is deposited on it, preferably by evaporation. The protective layer 6 may be formed of other materials, including, as will be seen, a conductive polymer, or a non-conductive material, such as a spin-on glass. The protective layer 6 is patterned in such a way that at least a portion of the UBM 5 is exposed. After a solder bump 8 has been formed by electroplating, the protective film 6 may be removed, preferably by dry etching or with a solvent. The electroplated solder is identified by numeral 8 on FIG. 2.

The film or the plating membrane 7, preferably a titanium film, serves a dual function of being a membrane for electroplating of the solder and of being a non-wettable dam for wetting back of the electroplated solder 8. The electroplated solder 8 may be disk shaped as shown on FIGS. 2 and 2(*a*). The solder 8 is heated to melt it, causing it to wet-back and assume a spherical or dome-like configuration which is identified by a broken line and is marked by numeral 9 on FIG.2, and is identified as a solid line and numeral 9 on FIG. 3. The diameter of such spherical or dome-like structure is usually between 10 and 100 micrometers.

In its role as the plating membrane 7 for electroplating of the solder, the film 7 preferably has a thickness that is sufficient to provide adequate electrical conduction to all of the solder bump sites on a substrate. A thickness of at least several hundred angstroms is often sufficient. Since the film 7 is deposited onto photoresist 6 and should preferably not have unpatterned breaks in it, the thickness of that film should preferably be small enough to avoid producing excessive stress on the film or the photoresist. Thus the thickness should be less than several thousand angstroms. The preferred thickness of the film 7 is, therefore, preferably within a range between 200 and 1,000 Angstroms.

One or more openings or vias 71 are etched in the film 7 to expose a portion of the underlying UBM 5. Preferably, the film 7 initially forms a continuous covering over the entire substrate so that no solder bump region is located in an isolated island. If a spin-on conductive polymer is used as a protective film 6, the thin titanium film need not be used as the conductive plating membrane since the conductive polymer will then provide the electric current conducting path to support the electroplating of solder 8. In this case the titanium film 7 is used as a non-wettable solder dam and only needs to cover a portion of the area around the substrate 1.

After one or more vias 71 have been formed and the solder bump has been electroplated, much of the exposed film 7 is removed, preferably by masking and wet etching or dry etching, preferably leaving only a band of a metal, preferably titanium, 7*a* that surrounds and partially underlies the disk 8 of solder, as shown by FIGS. 2 and 2(*a*). This band 7*a* serves as a non-wettable dam that causes the solder to wet back onto the portion of the UBM 5 that is not covered by the titanium when heated.

The function of the film 7 as a non-wettable dam is illustrated in FIG. 3. The non-wettable dam 7*a*, in combination with the UBM pad 5 (and the optional sealant feature 7*b*, if used) completely seals the interconnect metal 3 of the circuit from exposure to the solder 8. The solder, after wet-back, should be in contact only with the thin gold cap 13, which it consumes, the nickel barrier 5*b* and the dam 7*a*. Consequently, metal FILM 7 fully covers the sidewalls of the pad 5 and protects the interconnect 3. A thickness of several hundred angstroms should be sufficient to ensure this coverage if the substrate is held in a rotating planetary fixture as the titanium film is deposited.

As previously indicated, the completed solder bump structure on the circuit substrate is formed by subsequently heating the substrate to melt the solder 8 and wet it back, off the dam 7*a* and onto the pad 5. Another portion of the solder bump structure is initially formed on a separate substrate 10 that is subsequently bonded to the first substrate by means of the solder, preferably by using heat. This other portion consists of a second UBM pad 11 and a second titanium dam 12.

2. The Alternative Embodiments

Several other embodiments of the solder bump structure are described below. These embodiments either are simplified versions of the preferred structure or they are variations in which some element of the structure is modified. In one embodiment, the circuit does not have any elements that need to be protected by a removable protective film 6. Consequently, that film is not present and the plating membrane 7 is deposited directly onto the circuit substrate.

Another embodiment is illustrated in FIG. 4. In this embodiment, the film 7 instead of fully covering the sidewalls of the UBM pad 5 covers only the bottom portion of that pad. The solder 8 then covers the sidewalls as well as the top of the UBM pad. The solder, however, would still be sealed from the interconnect metal 3.

This embodiment is especially useful in, but not restricted to, those cases for which the protective film 6 is unnecessary or undesirable. The film 7 can be deposited underneath the UBM 5, in which case the film 7 could be integral with the titanium lower layer 5*a* of the UBM 5 and the optional sealant feature 7*b*.

Both the film 7 and the UBM 5 can be patterned by liftoff. In a variation of the solder bump structure, chrome is used instead of titanium as the material for the membrane 7, as shown on FIG. 4(*a*). In another variation, a multilayer film for the membrane 7 is used. The examples of materials used to make such multilayer film comprise, but are not limited to, titanium-nickel-titanium, as shown on FIG. 4(*b*); titanium-nickel-chrome, as shown on FIG. 4(*c*); titanium-platinum-titanium, as shown on FIG. 4(*d*); or titanium-nickel-oxidized silicon, as shown on FIG. 4(*e*). Having described the invention in connection with several embodiments thereof, modification will now suggest itself to those skilled in the art. As such, the invention is not to be limited to the described embodiments except as required by the appended claims.

We claim:

1. A method for fabricating a solder bump structure for use on a substrate, comprising the steps of:
   (a) applying a discontinuous multilayer underbump metallization onto said substrate;
   (b) applying a thin layer of a metal selected from a group consisting of titanium, chrome, a titanium-nickel-titanium composite, a titanium-nickel-chrome composite, a titanium-platinum-titanium composite, and a titanium-nickel-oxidized silicon composite over or under said multilayer underbump metallization;
   (c) applying a solder bump onto said underbump metallization;

(d) removing said thin layer of said metal in region spaced from said underbump metallization; and (e) heating said substrate to melt said solder bump and to wet it back from said thin layer of said metal.

2. The method for fabricating a solder bump structure for use on a substrate according to claim 1, further comprising the steps of:

(f) applying and patterning a removable protective layer so that said multilayer underbump metallization is exposed; and (g) removing said protective layer after said applying of said solder bump and after said removing of said thin layer of said metal.

3. The method for fabricating a solder bump structure for use on a substrate according to claim 1, wherein said step of applying said solder bump further comprises applying the solder bump onto said thin layer of said metal.

4. The method for fabricating a solder bump structure for use on a substrate according to claim 1, wherein said substrates are fabricated from materials selected from a group consisting essentially of X and Y-Z, where X is an element selected from a group consisting of elements of Period IV of Periodic Table, Y is an element selected from a group consisting of elements of Period III of Periodic Table, and Z is an element selected from a group consisting of elements of Period V of Periodic Table.

5. The method for fabricating a solder bump structure for use on a substrate according to claim 1, wherein said step of applying multilayer underbump metallization comprises:

(a) applying a layer of titanium with a thickness within a range of between about 0.02 and about 0.05 micrometers;

(b) applying a layer of nickel with a thickness within a range of between about 0.5 and about 1.0 micrometers onto said layer of titanium; and (c) applying a layer of gold with a thickness within a range of between about 0.05 and about 0.2 micrometers onto said layer of nickel.

6. The method for fabricating a solder bump structure for use on a substrate according to claim 1, wherein the step of applying said multilayer underbump metallization includes lifting off a multilayer structure.

7. The method for fabricating a solder bump structure for use on a substrate according to claim 1, wherein said thin layer of the metal has a thickness within preferably a range of between 200 and 1,000 Angstroms.

8. The method for fabricating a solder bump structure for use on a substrate according to claim 1, wherein said solder bump comprises an alloy of tin and lead.

9. The method for fabricating a solder bump structure for use on a substrate according to claim 1, wherein said step of applying of said solder bump comprises electroplating said solder into a via formed in a mask overlying said thin layer of said metal.

10. The method for fabricating a solder bump structure for use on a substrate according to claim 1, wherein said removing of said thin layer of said metal comprises the step of patterning a mask and using wet etching and/or dry etching.

11. The method for fabricating a solder bump structure for use on a substrate according to claim 1, wherein the step of applying of said thin layer of said metal comprises applying a layer of said metal by deposition by evaporating and by lifting off of said thin layer of said metal.

12. The method for fabricating a solder bump structure for use on a substrate according to claim 1, wherein said step of said applying of said multilayer underbump metallization is preceded by a step of applying of an insulating film of silicon nitride and/or polyimide.

13. The method for fabricating a solder bump structure for use on a substrate according to claim 1, wherein said step of said applying of said multilayer underbump metallization is preceded by a step of applying of a sealant feature.

14. The method for fabricating a solder bump structure for use on a substrate according to claim 1, wherein said step of applying of said underbump metallization is preceded by a step of applying and patterning of said sealant feature.

15. The method for fabricating a solder bump structure for use on a substrate according to claim 2, wherein said removable protective layer is made of a material selected from a group comprising a photoresist, a photodefinable polyimide, a spin-on glass and a spin-on conductive polymer.

16. The method for fabricating a solder bump structure for use on a substrate according to claim 15, wherein said step of applying of said removable layer of said photoresist comprises the steps of:

(a) spinning said photoresist on the substrate;

(b) patterning said layer of said photoresist on the surface; and (c) contour-baking said layer of said photoresist so as to round any edges.

17. The method for fabricating a solder bump structure for use on a substrate according to claim 16, wherein said removable layer of said photoresist has a thickness within a range of between about 0.5 and about 40 micrometers.

18. The method for fabricating a solder bump structure for use on a substrate according to claim 16, wherein said step of removing of said protective layer of said photoresist comprises using a solvent and dry etching.

19. The method for fabricating a solder bump structure for use on a substrate according to claim 13, wherein said sealant feature is made of titanium.

20. The method for fabricating a solder bump structure for use on a substrate according to claim 19, wherein said sealant feature is having a thickness between about 0.02 and 0.20 micrometers.

21. A method of fabricating a copper-free solder bump structure compatible with group III–V semiconductor materials for use on a substrate, comprising the steps of:

(a) applying a multilayer underbump metallization onto said substrate, said multilayer underbump metallization being discontinuous when initially applied to said substrate;

(b) applying and patterning a removable protective layer so that said multilayer underbump metallization is at least partially exposed;

(c) applying a thin layer of a metal selected from a group consisting of titanium, chrome, a titanium-nickel-titanium composite, a titanium-nickel-chrome composite, a titanium-platinum-titanium composite and a titanium-nickel-oxidized silicon deposit in contact with said multilayer underbump metallization;

(d) applying a solder bump onto said underbump metallization;

(e) removing said thin layer of said metal in at least regions spaced from said underbump metallization;

(f) heating said substrate to melt said solder bump and to wet it back from said thin layer of said metal; and (g) removing said protective layer after heating the substrate to melt the solder bump back from said thin layer of said metal and after removing said thin layer of said metal in regions spaced from said underbump metallization.

22. The method of claim 21, wherein said step of applying multilayer underbump metallization comprises:
   (a) applying a layer of titanium with a thickness within a range of between about 0.02 and about 0.05 micrometers;
   (b) applying a layer of nickel with a thickness within a range of between about 0.5 and about 1.0 micrometers onto said layer of titanium; and
   (c) applying a layer of gold with a thickness within a range of between about 0.05 and about 0.2 micrometers onto said layer of nickel.

23. The method for fabricating a solder bump structure for use on a substrate according to claim 21, wherein said step of applying of said solder bump comprises electroplating said solder into a via formed in a mask overlying said thin layer of said metal.

24. The method for fabricating a solder bump structure for use on a substrate according to claim 21, wherein said step of applying said removable protective layer comprises the steps of:
   (a) spinning a photoresist on the substrate;
   (b) patterning said layer of said photoresist on the surface; and
   (c) contour-baking said layer of said photoresist so as to round any edges.

* * * * *